(12) United States Patent
Lee et al.

(10) Patent No.: US 12,171,099 B2
(45) Date of Patent: Dec. 17, 2024

(54) SEMICONDUCTOR MEMORY DEVICE CAPABLE OF CONNECTING EACH OF A PLURALITY OF CELL STRINGS TO A SOURCE LINE THROUGH A DISCHARGE TRANSISTOR AND METHOD OF MANUFACTURING THE SAME

(71) Applicant: SK hynix Inc., Icheon-si (KR)

(72) Inventors: Nam Jae Lee, Icheon-si (KR); Myoung Kwan Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 401 days.

(21) Appl. No.: 17/497,313

(22) Filed: Oct. 8, 2021

(65) Prior Publication Data

US 2022/0336488 A1 Oct. 20, 2022

(30) Foreign Application Priority Data

Apr. 14, 2021 (KR) .................. 10-2021-0048648

(51) Int. Cl.
*H10B 43/27* (2023.01)
*H10B 41/27* (2023.01)
*H10B 41/41* (2023.01)
*H10B 43/40* (2023.01)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC ........ H10B 43/27; H10B 41/27; H10B 43/35; H10B 43/20; H10B 41/41; H10B 43/40; H10B 43/50; H01L 25/0657; H01L 2224/08145
See application file for complete search history.

(56) References Cited

U.S. PATENT DOCUMENTS

| | | | |
|---|---|---|---|
| 9,859,004 B1 | 1/2018 | Alsmeier | |
| 9,911,488 B2 | 3/2018 | Mokhlesi | |
| 2017/0084624 A1* | 3/2017 | Lee | H10B 41/35 |
| 2021/0111137 A1* | 4/2021 | Chen | H10B 43/40 |
| 2022/0068882 A1* | 3/2022 | Xiao | H01L 24/05 |
| 2022/0069093 A1* | 3/2022 | Tagami | H10B 43/35 |
| 2022/0115397 A1* | 4/2022 | Cho | H10B 41/30 |
| 2022/0173119 A1* | 6/2022 | Choi | H10B 43/27 |
| 2022/0246537 A1* | 8/2022 | Kim | H10B 43/27 |
| 2023/0343388 A1* | 10/2023 | Lee | H10B 10/00 |

* cited by examiner

*Primary Examiner* — Mamadou L Diallo
(74) *Attorney, Agent, or Firm* — WILLIAM PARK & ASSOCIATES LTD.

(57) ABSTRACT

Provided herein may be a semiconductor memory device and a method of manufacturing the semiconductor memory device. The semiconductor memory device includes a substrate with a complementary metal oxide semiconductor (CMOS) circuit; a gate stacked body with interlayer insulating layers and conductive patterns that are alternately stacked on the substrate in a vertical direction; a plurality of channel structures passing through the gate stacked body, each with a first end that protrudes above the gate stacked body; and a plurality of conductive layers disposed over the gate stacked body. Each of the plurality of conductive layers is in contact with the first end of at least one of the plurality of channel structures.

14 Claims, 19 Drawing Sheets

SEMICONDUCTOR MEMORY DEVICE CAPABLE OF CONNECTING EACH OF A PLURALITY OF CELL STRINGS TO A SOURCE LINE THROUGH A DISCHARGE TRANSISTOR AND METHOD OF MANUFACTURING THE SAME

CROSS-REFERENCE TO RELATED APPLICATION

The present application claims priority under 35 U.S.C. § 119(a) to Korean patent application number 10-2021-0048648 filed on Apr. 14, 2021, in the Korean Intellectual Property Office, the entire disclosure of which is incorporated by reference herein.

BACKGROUND

1. Technical Field

Various embodiments of the present disclosure relate to an electronic device, and more particularly, to a semiconductor memory device of a vertical channel structure and a method of manufacturing the semiconductor memory device.

2. Related Art

Recently, the paradigm for computer environment has been converted into ubiquitous computing so that computer systems can be used anytime and anywhere. Thereby, the use of portable electronic devices such as mobile phones, digital cameras, and notebook computers has rapidly increased. In general, such portable electronic devices use a memory system which employs a semiconductor memory device, in other words, use a data storage device. The data storage device is used as a main memory device or an auxiliary memory device of the portable electronic devices.

A data storage device that uses a semiconductor memory device provides advantages in that there is no mechanical driver, so that stability and durability are excellent, an information access speed is increased, and power consumption is reduced. Examples of a data storage device that are proposed as the memory system with such advantages may include a universal serial bus (USB) memory device, a memory card with various interfaces, and a solid state drive (SSD).

Semiconductor memory devices are classified into a volatile memory device and a nonvolatile memory device.

Although read and write speeds are comparatively low, the nonvolatile memory device can retain data that is stored therein even when power supply is interrupted. Therefore, the nonvolatile memory device is used when there is the need for storing data which should be maintained regardless of the supply of power. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

SUMMARY

An embodiment of the present disclosure may provide for a semiconductor memory device including a substrate with a complementary metal oxide semiconductor (CMOS) circuit; a gate stacked body with interlayer insulating layers and conductive patterns that are alternately stacked on the substrate in a vertical direction; a plurality of channel structures passing through the gate stacked body, each with a first end that protrudes above the gate stacked body; and a plurality of conductive layers disposed over the gate stacked body. Each of the plurality of conductive layers may be in contact with the first end of at least one of the plurality of channel structures.

An embodiment of the present disclosure may provide for a semiconductor memory device including a bit line; a plurality of cell strings that are coupled at first ends thereof to the bit line; and a discharge unit coupled between a source line and second ends of the plurality of cell strings. The plurality of cell strings may include at least one drain select transistor and a plurality of memory cells that are coupled in series between the bit line and the discharge unit, and an outermost memory cell, among the memory cells, may be electrically coupled to the discharge unit.

An embodiment of the present disclosure may provide for a method of manufacturing a semiconductor memory device, including forming a memory cell array on a first substrate, the memory cell array comprising a gate stacked body with interlayer insulating layers and conductive patterns that are alternately stacked in a vertical direction, a plurality of channel structures passing through the gate stacked body with ends that extend into the first substrate, and a memory layer extending from between the plurality of channel structures and the gate stacked body to between the first substrate and the ends of the plurality of channel structures and the first substrate; forming a bit line that is coupled to the memory cell array; removing the first substrate such that the memory layer is exposed; removing a portion of the memory layer to expose the ends of the plurality of channel structures; and forming, over the gate stacked body, a plurality of conductive layers that comes into contact with the end of at least one channel structure among the plurality of channel structures.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

Various embodiments of the present disclosure are directed to a semiconductor memory device which is capable of connecting each of a plurality of cell strings included in a memory block to a source line through a discharge transistor, and a method of manufacturing the semiconductor memory device.

Figure 1:
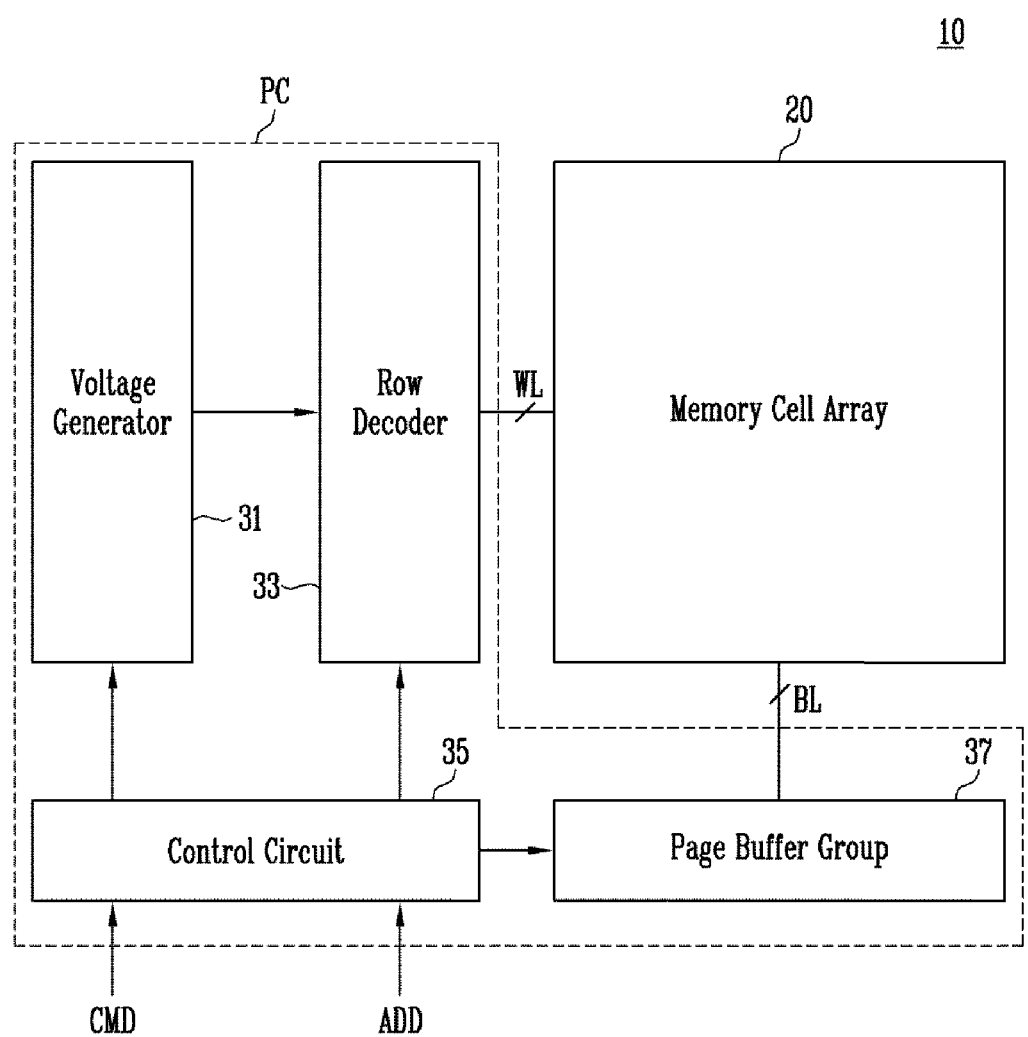
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 10 may include a peripheral circuit PC and a memory cell array 20.

The peripheral circuit PC may be configured to control a program operation for storing data in the memory cell array 20, a read operation for outputting the data that is stored in the memory cell array 20, or an erase operation for erasing the data that is stored in the memory cell array 20.

In an embodiment, the peripheral circuit PC may include a voltage generator 31, a row decoder 33, a control logic 35, and a page buffer group 37.

The memory cell array 20 may include a plurality of memory blocks. The memory cell array 20 may be coupled to the row decoder 33 through word lines WL and may be coupled to the page buffer group 37 through bit lines BL.

The control circuit 35 may control the peripheral circuit PC in response to a command CMD and an address ADD.

The voltage generator 31 may generate various operating voltages, such as a pre-erase voltage, an erase voltage, a ground voltage, a program voltage, a verification voltage, a pass voltage, and a read voltage that are used for the program operation, the read operation, and the erase operation based on the control circuit 35.

The row decoder 33 may select a memory block based on the control circuit 35. The row decoder 33 may be configured to apply the operating voltages to word lines WL that are coupled to the selected memory block.

The page buffer group 37 may be coupled to the memory cell array 20 through the bit lines BL. The page buffer group 37 may temporarily store data that is received from an input/output circuit (not shown) during the program operation based on the control circuit 35. The page buffer group 37 may sense the voltage or current of the bit lines BL during the read operation or the verification operation based on the control circuit 35. The page buffer group 37 may select the bit lines BL based on the control circuit 35.

Structurally, the memory cell array 20 may overlap a portion of the peripheral circuit PC.

Figure 2:
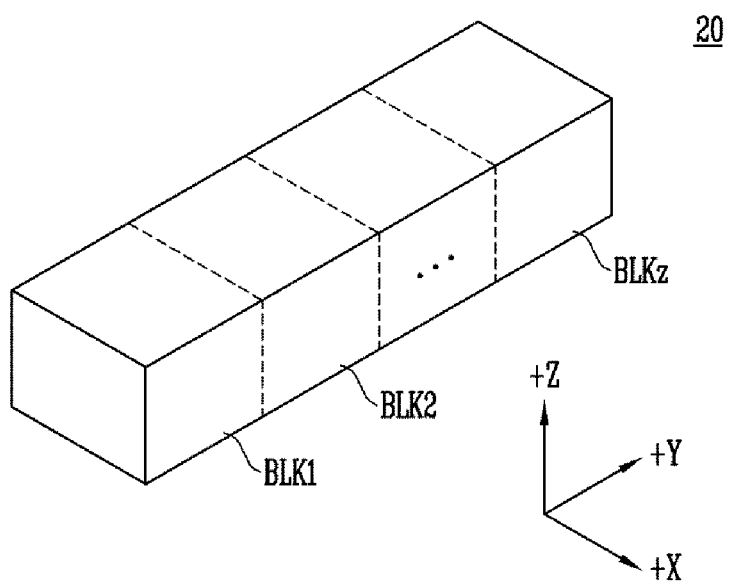
FIG. 2 is a diagram illustrating a memory cell array of FIG. 1 in accordance with an embodiment of the present disclosure.

FIG. 2 is a diagram illustrating the memory cell array of FIG. 1 in accordance with an embodiment of the present disclosure.

Referring to FIG. 2, the memory cell array 20 may include a plurality of memory blocks BLK1 to BLKz. Each memory block may have a three-dimensional structure. Each memory block may include a plurality of memory cells that are stacked on a substrate. The multiple memory cells may be arranged in a +X direction, a +Y direction, and a +Z direction. The structure of each memory block will be described in more detail with reference to FIGS. 3 and 4.

Figure 3:
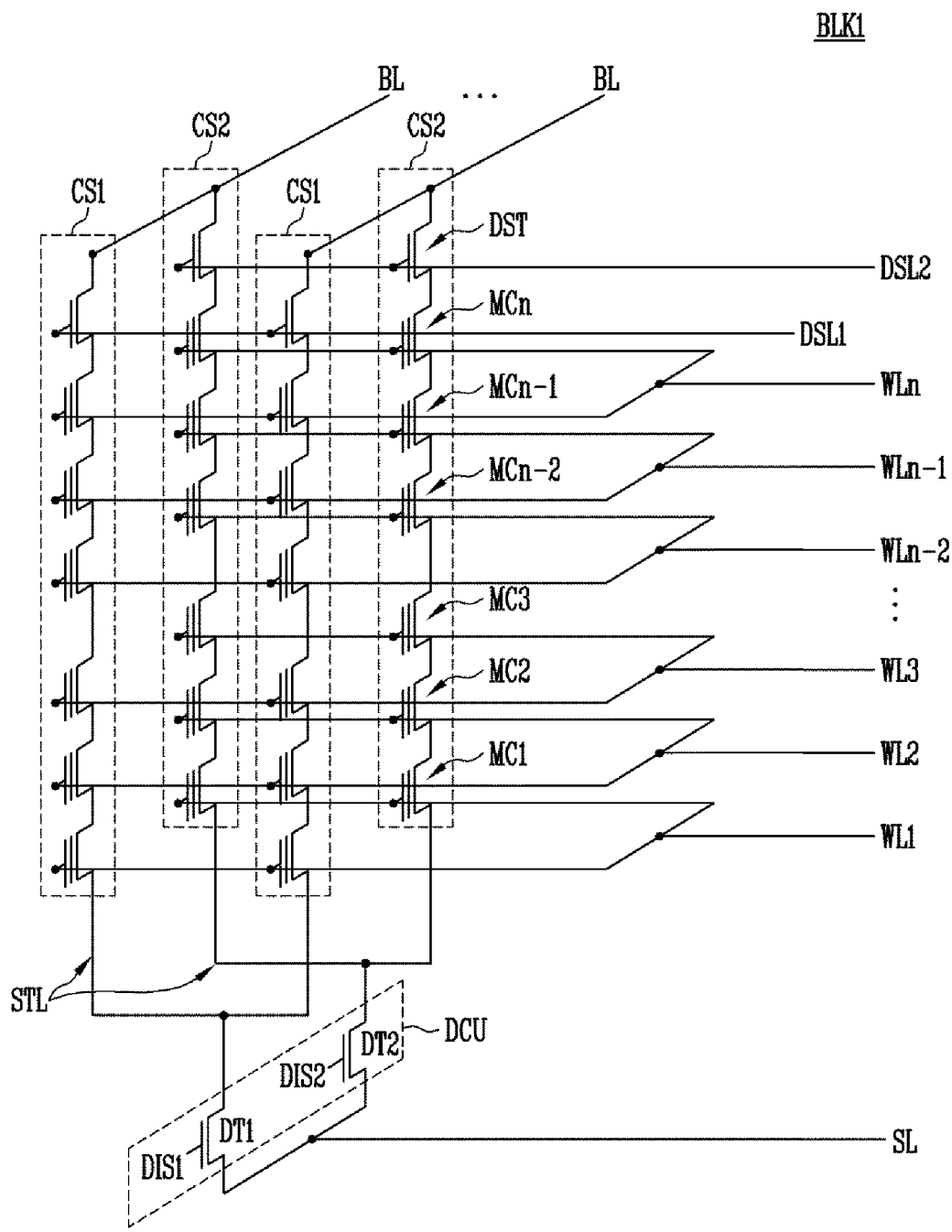
FIG. 3 is a circuit diagram illustrating any one memory block of a plurality of memory blocks of FIG. 2.

FIG. 3 is a circuit diagram illustrating any one memory block of the multiple memory blocks of FIG. 2.

Referring to FIG. 3, a memory block BLK1 may include a plurality of cell strings CS1 and CS2 that are coupled to the plurality of bit lines BL and a discharge unit DCU that is coupled between a source line and the plurality of cell strings CS1 and CS2.

The plurality of cell strings CS1 and CS2 may be coupled in common to a plurality of word lines WL1 to WLn. Each of the plurality of cell strings CS1 and CS2 may be coupled to the source line SL through the discharge unit DCU. For example, the first cell strings CS1 that are coupled to the plurality of bit lines BL, respectively, may be coupled to the source line SL through a first transistor DT1 of the discharge unit DCU. The second cell strings CS2 that are coupled to the plurality of bit lines BL, respectively, may be coupled to the source line SL through a second transistor DT2 of the discharge unit DCU.

Each of the cell strings CS1 and CS2 may include at least one drain select transistor DST that is coupled to the bit line BL, and a plurality of memory cells MC1 to MCn that are coupled in series between the drain select transistor DST and the first or second transistor DT1 or DT2 of the discharge unit DCU. In other words, the memory cells MC1, among the memory cells MC1 to MCn, disposed on an outermost portion, may be coupled through a string line STL to the first or second transistor DT1 or DT2.

The gates of the memory cells MC1 to MCn may be coupled, respectively, to the plurality of word lines WL1 to WLn that are spaced apart from each other and may be stacked. The plurality of word lines WL1 to WLn may be disposed between two or more drain select lines DSL1 and DSL2. The two or more drain select lines DSL1 and DSL2 may be spaced apart from each other at the same level.

The plurality of cell strings CS1 and CS2 may be divided into string groups that are coupled to two or more drain select lines DSL1 and DSL2, respectively. The cell strings that are coupled to the same bit line may be independently controlled by different drain select lines. Furthermore, the cell strings that are coupled to the same drain select line may be independently controlled by different bit lines.

The discharge unit DCU may include a plurality of transistors DT1 and DT2, and each of the transistors DT1 and DT2 may electrically connect or disconnect the plurality of cell strings CS1 and CS2 and the source line SL in response to any one of a plurality of discharge signals DIS1 and DIS2.

For example, the transistor DT1 may be coupled between the memory cell MC1 of each of the cell strings CS1 and the source line SL and may electrically connect or disconnect the channel of the memory cell MC1 and the source line SL in response to the discharge signal DIS1. Further, the transistor DT2 may be coupled between the memory cell MC1 of each of the cell strings CS2 and the source line SL and may electrically connect or disconnect the channel of the memory cell MC1 and the source line SL in response to the discharge signal DIS2.

In the above-described embodiment, it has been illustrated and described that one transistor is coupled to each string group. However, one cell string may be coupled to the source line SL through one transistor. In other words, each of the plurality of cell strings CS1 and CS2 may be individually connected to or disconnected from the source line SL through one corresponding transistor.

In the above-described embodiment, lines that couple the plurality of cell strings CS1 and CS2 to the plurality of transistors DT1 and DT2 may be defined as the string line STL. That is, the channels of the cell strings CS1 and CS2 may be coupled through the string line STL to the transistors DT1 and DT2.

Figure 4:
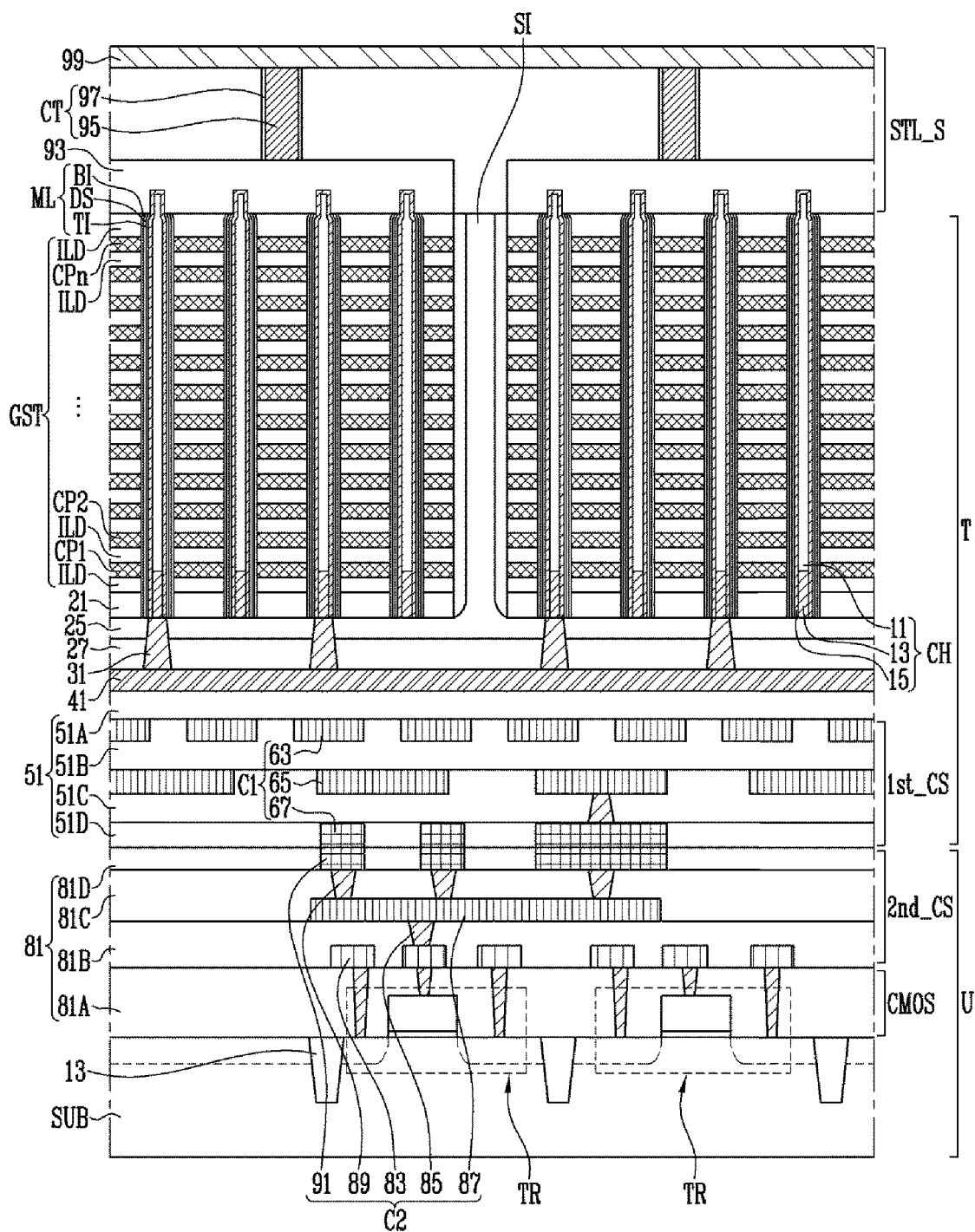
FIG. 4 is a sectional view illustrating the memory cell array of FIG. 1.

FIG. 4 is a sectional view illustrating the memory cell array of FIG. 1.

Referring to FIG. 4, the memory cell array may be configured such that a lower structure U and an upper structure T are bonded to each other, and a string line structure STL_S may be disposed over the upper structure T.

The upper structure T may include gate stacked bodies GST that are separated from each other by a slit SI, channel structures CH that pass through the gate stacked bodies GST, a memory layer ML that extends along a sidewall of each of the channel structures CH, a bit line 41 that is disposed under the gate stacked body GST, and a first connection structure C1.

The gate stacked body GST may include interlayer insulating layers ILD and conductive patterns CP1 to CPn that are alternately stacked in a vertical direction. Each of the conductive patterns CP1 to CPn may include various conductive materials, such as a doped silicon layer, a metal layer, a metal silicide layer, and a barrier layer and may include two or more types of conductive materials. For instance, each of the conductive patterns CP1 to CPn may include tungsten and a titanium nitride layer (TiN) that surrounds the surface of tungsten. Tungsten is a low-resistance metal and may lower the resistance of the conductive patterns CP1 to CPn. The titanium nitride layer TiN is a barrier layer and may prevent direct contact between tungsten and the interlayer insulating layers ILD.

Among the conductive patterns CP1 to CPn, the first conductive pattern CP1 that is adjacent to the bit line 41 may be used as the drain select line DSL. In an embodiment, two or more layers of conductive patterns, which are adjacent to the bit line 41 and are successively stacked, may be used as drain select lines. The conductive patterns (e.g., CP2 to CPn), which are adjacent to each other in the vertical direction and are disposed over the drain select line, may be used as the word lines WL1 to WLn that are described above with reference to FIG. 3.

The channel structure CH may pass vertically through the gate stacked body GST, and a first end of the channel structure CH may be formed to protrude from the gate stacked body GST. The channel structure CH may be formed in a hollow type. The channel structure CH may include a core insulating layer 11 that fills a central area, a doped semiconductor layer 13 that is located at a lower end of the core insulating layer 11, and a channel layer 15 that surrounds the core insulating layer 11 and the surface of the doped semiconductor layer 13. The channel layer 15 may be used as a channel area of a corresponding cell string. The channel layer 15 may be formed of a semiconductor material. In an embodiment, the channel layer 15 may include a silicon layer.

According to the above-described structure, the memory cells may be defined at intersections of the channel structure CH and the conductive patterns (e.g., CP2 to CPn) that are used as the word lines, and the drain select transistor may be defined at an intersection of the channel structure CH and the conductive pattern (e.g., CP1) that are used as the drain select line. The memory cells may be coupled in series with the drain select transistor by the channel structure CH to form the cell strings CS1 and CS2, described above with reference to FIG. 3.

The memory layer ML may be formed to enclose a surface of the channel structure CH. The memory layer ML may include a blocking insulating layer BI that encloses the channel layer 15 of the channel structure CH, a data storage layer DS that encloses the blocking insulating layer BI, and a tunnel insulating layer TI that encloses the data storage layer DS. The memory layer ML may be shorter than the channel structure CH in a vertical direction.

The bit line 41 may be disposed under the gate stacked body GST. The bit line 41 may be coupled to the channel structure CH through contact plugs 27 that pass through a plurality of insulating layers 21, 25, and 27. The bit line 41 may be spaced apart from a substrate SUB by a first insulating structure 51 and a second insulating structure 81.

A first connection structure 1st_CS may include the first insulating structure 51 and first connection structures C1 that is formed in the first insulating structure 51. The first connection structures C1 may include various conductive patterns 63, 65, and 67. The first insulating structure 51 may include two or more insulating layers 51A to 51D that are stacked between the bit line 41 and the second insulating structure 81.

The lower structure U may include a CMOS circuit structure CMOS with a plurality of transistors TR that are formed on the substrate SUB and a second connection structure 2nd_CS that are formed on the CMOS circuit structure CMOS.

The second connection structure 2nd_CS may include the second insulating structure 81 that is formed on the substrate SUB and second connection structures C2 that is formed in the second insulating structure 81. Each of the second connection structures C2 may include various conductive patterns 83, 85, 87, 89, and 91 that are embedded in the second insulating structure 81. The second insulating structure 81 may include two or more insulating layers 81A to 81D that are sequentially stacked.

The upper structure T and the lower structure U may be bonded to each other through a bonding process to form a combined structure. For example, the exposed conductive patterns 67 of the first connection structure 1nd_CS of the upper structure T and the exposed conductive patterns 91 of the second connection structure 2nd_CS of the lower structure U may be disposed to face each other and may be bonded to each other. The conductive patterns 67 and the conductive patterns 91 may be defined as bonding metals.

The string line structure STL_S may be disposed on the upper structure T. The string line structure STL_S may include a plurality of conductive layers 93 that are disposed over the gate stacked body GST and are in contact with the channel structure CH that protrudes from the gate stacked body GST, a plurality of upper lines 99 that are disposed over the plurality of conductive layers 93, and contact plugs CT that couple the plurality of conductive layers 93 and the plurality of upper lines 99, respectively. The plurality of conductive layers 93 may be at least two or more conductive layers.

The conductive layer 93 may be electrically coupled to at least one channel structure CH. At least one channel structure CH that is coupled in common to one conductive layer 93 may be coupled in common to one string line STL, illustrated in FIG. 3.

The contact plugs CT may include a contact conductive layer 95 and a diffusion barrier 97 that encloses a sidewall of the contact conductive layer. Each of the contact plugs CT may electrically couple one conductive layer 93 and one upper line 99.

A plurality of upper lines 99 may be disposed on the same layer to be parallel to each other, and each of the upper lines 99 may be coupled to the transistors DT1 and DT2 of the discharge unit DCU of FIG. 3.

As described above, the memory cell array, in accordance with an embodiment of the present disclosure, may be configured such that the gate stacked body GST does not include a source select line, and the plurality of channel structures CH that correspond to the cell strings are coupled in common to the string line that is disposed over the gate stacked body GST to be coupled to the transistors DT1 and DT2 of the discharge unit DCU.

FIGS. 5A to 5F, 6, 7, 8A to 8D, and 9A and 9B are sectional views and plan views illustrating a method of manufacturing a semiconductor memory device in accordance with an embodiment of the present disclosure.

FIGS. 5A to 5F are sectional views illustrating a step of forming a memory cell array, a first line array, and first connection structures on a first substrate.

Figure 5A:
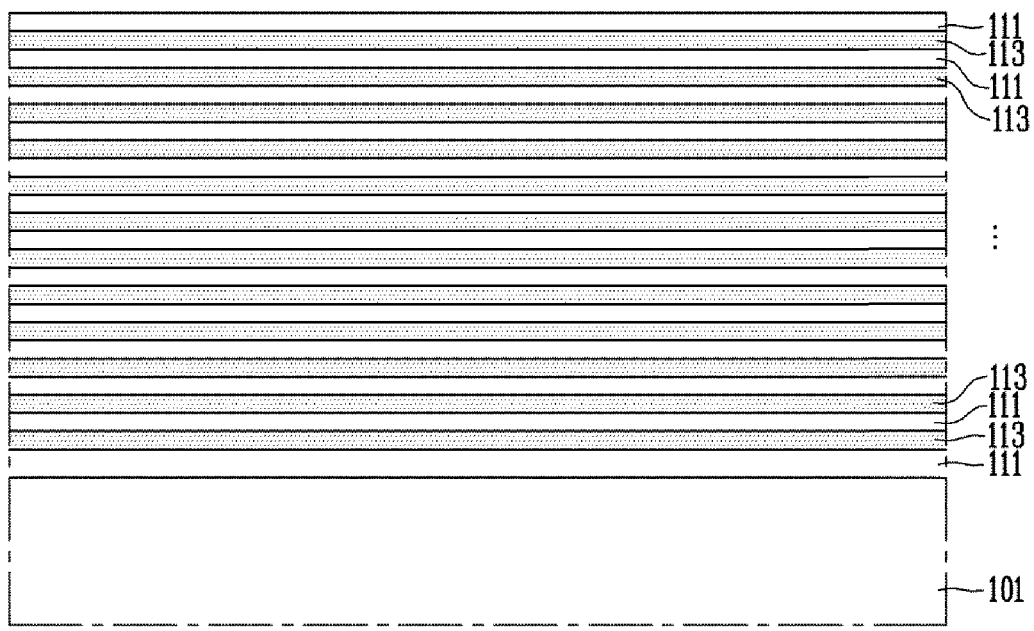
FIGS. 5A to 5F, 6, 7, 8A to 8D, and 9A and 9B are sectional views and plan views illustrating a method of manufacturing a semiconductor memory device in accordance with an embodiment of the present disclosure.

Referring to FIG. 5A, first material layers 111 and second material layers 113 may be alternately stacked on the first substrate 101.

The first substrate 101 may be formed of a material with an etch rate that is different from that of the first material layers 111 and the second material layers 113. For example, the substrate 101 may include silicon.

In an embodiment, the first material layers 111 may be insulating materials for the interlayer insulating layers ILD that are described above with reference to FIG. 4. The second material layers 113 may be a material with an etch rate that is different from that of the first material layers 111. For example, the first material layers 111 may include silicon oxide, and the second material layers 113 may include silicon nitride. The following drawings show an embodiment in which the first material layers 111 are formed of insulating material, and the second material layers 113 are formed of sacrificial layers. However, the present disclosure is not limited thereto. The physical properties of the first material layers 111 and the second material layers 113 may be varied. For example, the first material layers 111 may be insulating material for the interlayer insulating layers ILD, described above with reference to FIG. 4. The second material layers 113 may include a conductive material for the conductive patterns CP1 to CPn, described above with reference to FIG. 4.

Figure 5B:
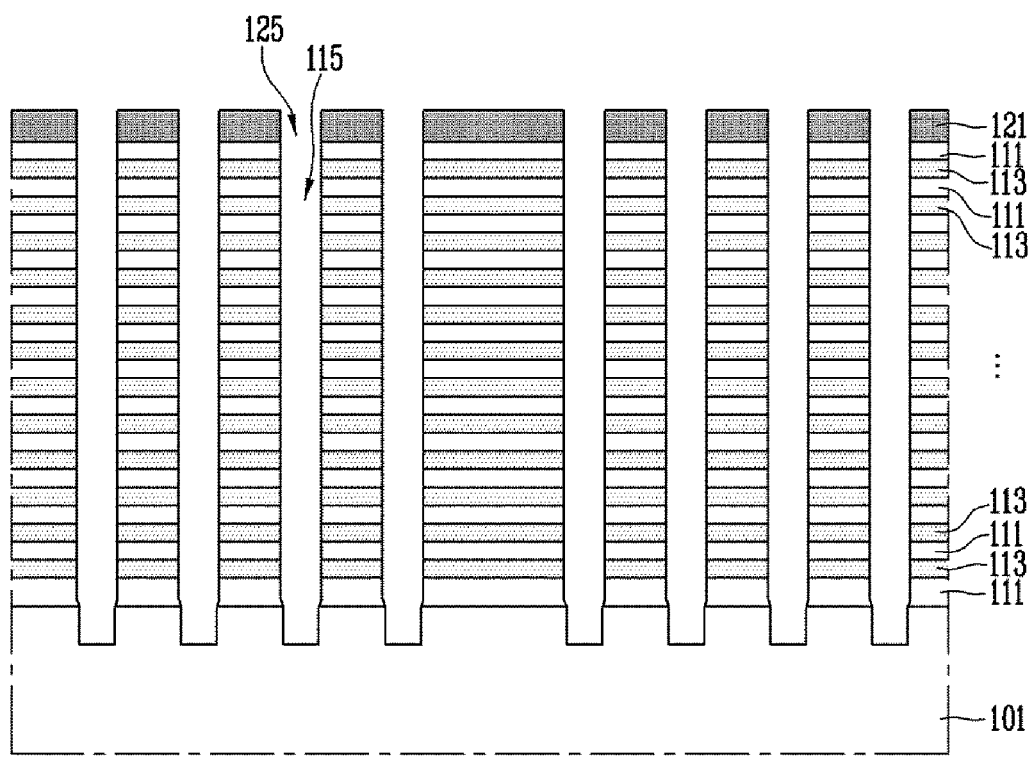

Referring to FIG. 5B, a first mask pattern 121 with a first opening 125 may be formed on a stacked structure of the first material layers 111 and the second material layers 113. Subsequently, channel holes 115 that pass through the first material layers 111 and the second material layers 113 may be formed through the first opening 125 of the first mask pattern 121. The channel holes 115 may extend into the first substrate 101. Depending on the etching material that is used to form the channel holes 115, the channel holes 115 may be formed in various shapes.

In an embodiment, the channel holes 115 may be formed by using a first etching material. The etch rate of the first material layers 111 and the second material layers 113 for the first etching material may be higher than the etch rate of the first substrate 101 for the first etching material. Consequently, the end of the channel hole 115 that extends into the first substrate 101 may be formed to be narrower in width than the channel hole 115 that passes through the first material layers 111 and the second material layers 113.

Figure 5C:
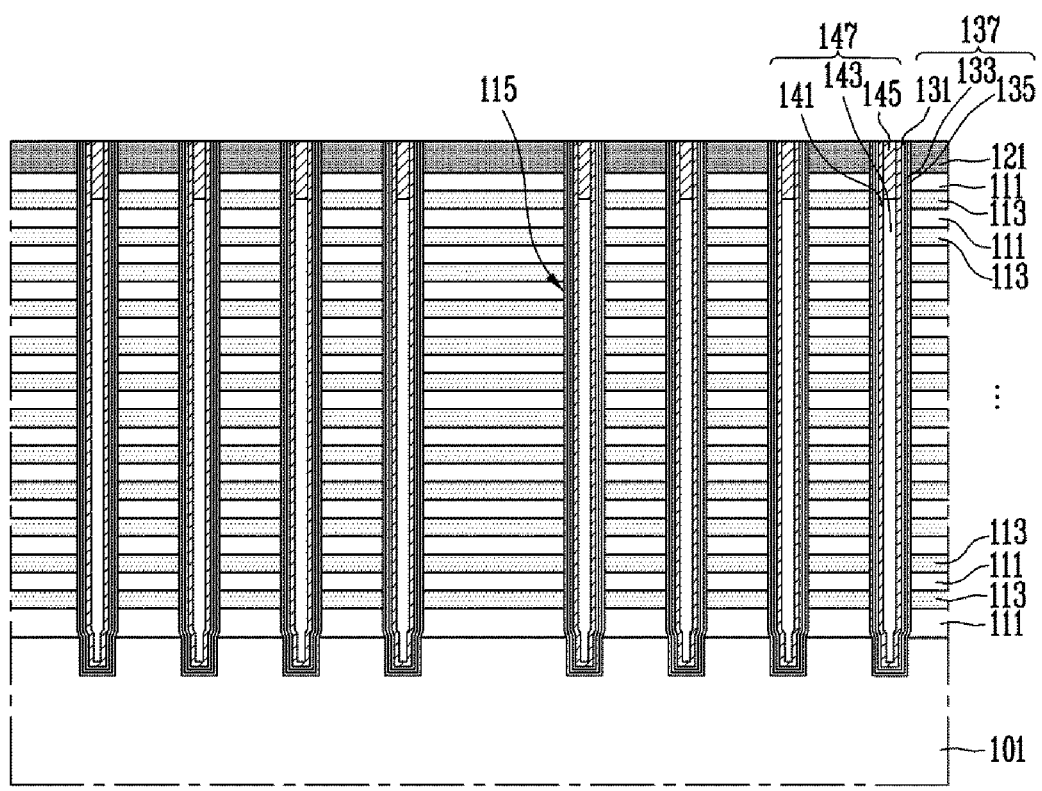

Referring to FIG. 5C, a memory layer 137 and a channel structure 147 may be formed in the channel holes 115. A sidewall of the channel structure 147 and an end of the channel structure 147 that extends into the first substrate 101 may be surrounded by the memory layer 137.

The step of forming the memory layer 137 may include a step of sequentially stacking the blocking insulating layer 135, the data storage layer 133, and the tunnel insulating layer 131 on the surface of each channel hole 115. The blocking insulating layer 135, the data storage layer 133, and the tunnel insulating layer 131 may include the same materials as the blocking insulating layer BI, the data storage layer DS, and the tunnel insulating layer TI that are described above with reference to FIG. 4. The memory layer 137 may be formed in a liner shape, and the central area of the channel hole 115 may be defined by the memory layer 137.

Subsequently, the channel structure 147 may be formed by forming the channel layer 141 on the surface of the memory layer 137. The channel layer 141 may include a semiconductor layer that is used as the channel area. For example, the channel layer 141 may include silicon.

In an embodiment, the channel layer 141 may be formed in the form of a liner, and the central area of the channel hole 115 may include a portion that is not filled with the channel layer 141. When the channel layer 141 is formed in the form of a liner, the step of forming the channel structure 147 may include a step of filling the central area of the channel hole 115 on the channel layer 141 with a core insulating layer 143, a step of etching a portion of the core insulating layer 143 to define a recess area in a portion of the central area of the channel hole 115, and a step of filling the recess area with a doped semiconductor layer 145. The core insulating layer 143 may include oxide, and the doped semiconductor layer 145 may include a conductive dopant. The conductive dopant may include an n-type dopant for a junction. The conductive dopant may include a counter-doped p-type dopant.

In an embodiment, the channel layer 141 may be formed to fill the central area of the channel hole 115, and the core insulating layer 143 and the doped semiconductor layer 145 may be omitted. When the core insulating layer 143 and the doped semiconductor layer 145 are omitted, the step of forming the channel structure 147 may further include a step of doping the conductive dopant in the channel layer 141.

Figure 5D:
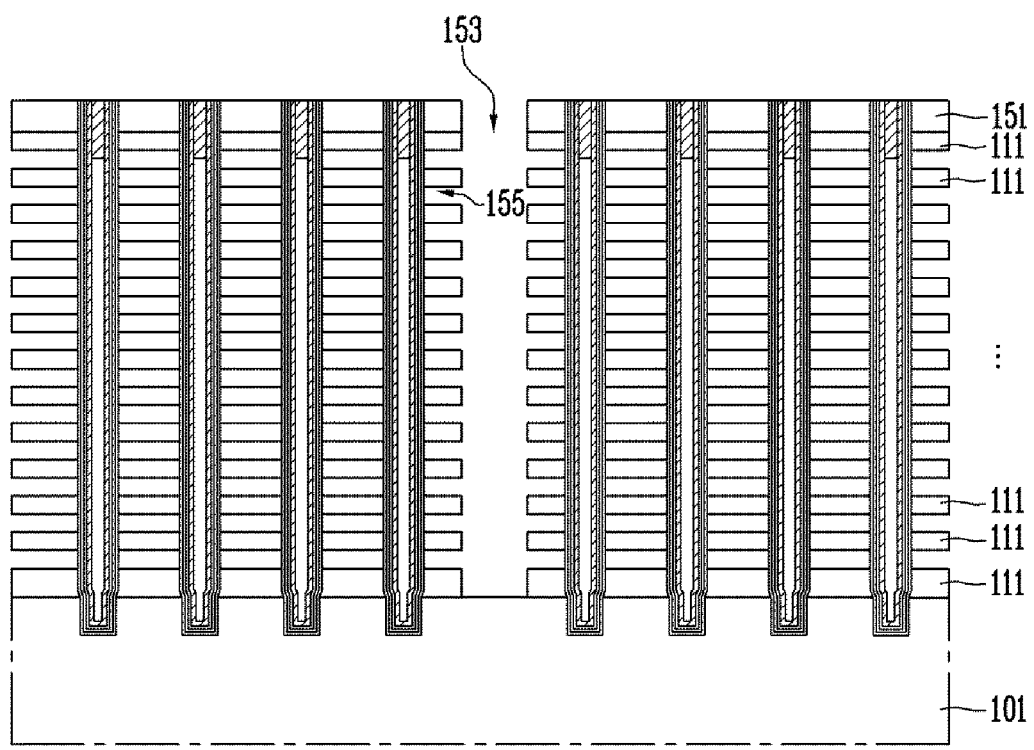

Referring to FIG. 5D, the first insulating layer 151 may be formed after the first mask pattern 121, shown in FIG. 5C, is removed.

Subsequently, a slit 153 may be formed. The slit 153 may pass through the first insulating layer 151 and may pass through the stacked structure of the first material layers 111 and the second material layers 113. The slit 153 may correspond to the slit SI as shown in FIG. 4. Subsequently, horizontal spaces 155 may be defined by selectively removing the second material layers 113 that are exposed through the slit 153. The horizontal spaces 155 may be defined between the first material layers 111 that are vertically adjacent to each other.

Figure 5E:
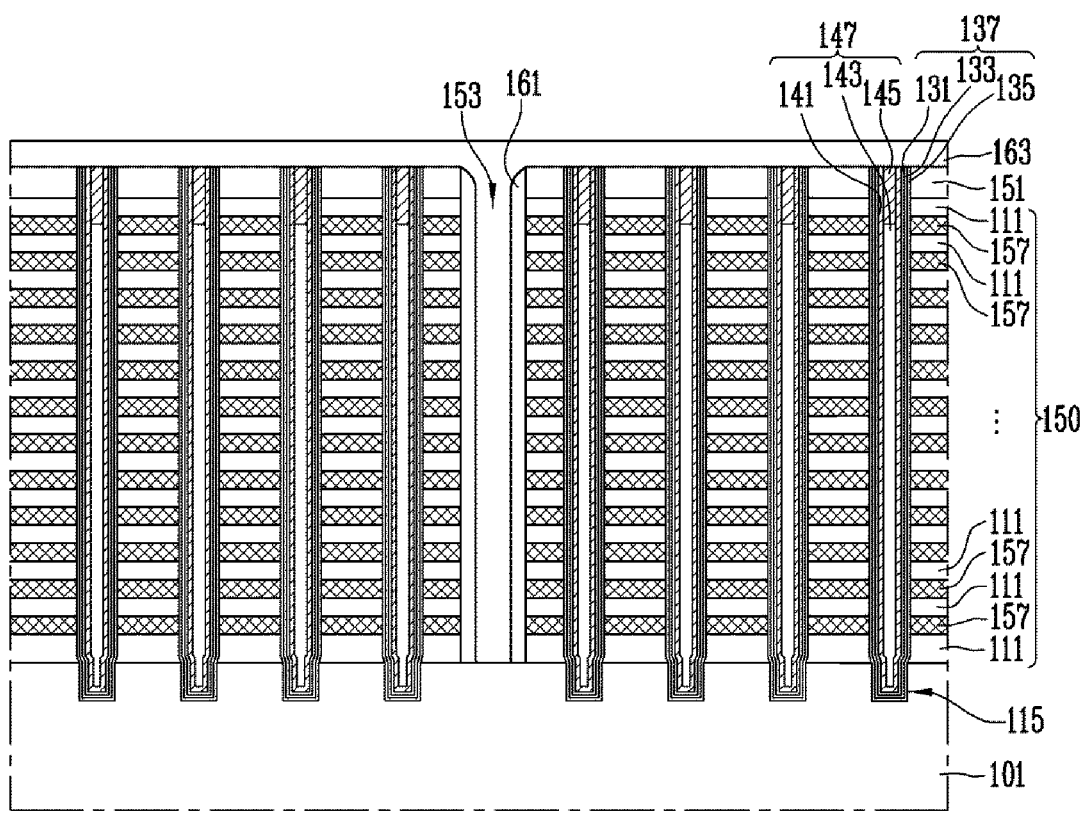

Referring to FIG. 5E, the horizontal spaces 155 that are shown in FIG. 5D may be filled with third material layers 157, respectively, through the slit 153. The third material layers 157 may be the conductive patterns CP1 to CPn that are described above with reference to FIG. 4. The third material layers 157 may fill the horizontal spaces 155 to enclose the channel structure 147 and the memory layer 137.

As described above, the gate stacked body 150 may be formed on the first substrate 101 by replacing the second material layers 113 as sacrificial layers with the third material layers 157 as conductive patterns. The gate stacked body 150 may include a structure in which the first material layers 111 as interlayer insulating layers and the third material layers 157 as conductive patterns are alternately stacked. The gate stacked body 150 may be penetrated by the channel structure 147, and the channel structure 147 may extend into the first substrate 101. The memory layer 137 may extend from between the channel structure 147 and the gate stacked body 150 to between the end of the channel structure 147 and the first substrate 101.

The memory block with the plurality of cell strings CS1 and CS2, described above with reference to FIG. 3, may be formed on the first substrate 101 through the processes that are described above with reference to FIGS. 5A to 5E. Each of the cell strings may include a drain select transistor DST and memory cells MC1 to MCn, which are coupled in series, as described above with reference to FIG. 3. The drain select transistor DST and the memory cells MC1 to MCn, described above with reference to FIG. 3, may be defined in the intersections of the channel structure 147 and the third material layers 157 as conductive patterns, which are shown in FIG. 5E, and may be coupled in series by the channel structure 147.

Subsequently, a sidewall insulating layer 161 may be formed to cover the sidewall of the gate stacked body 150. Thereafter, a second insulating layer 163 that extends to fill the inside of the slit 153 and cover the sidewall insulating layer 161 and the first insulating layer 151 may be formed.

Figure 5F:
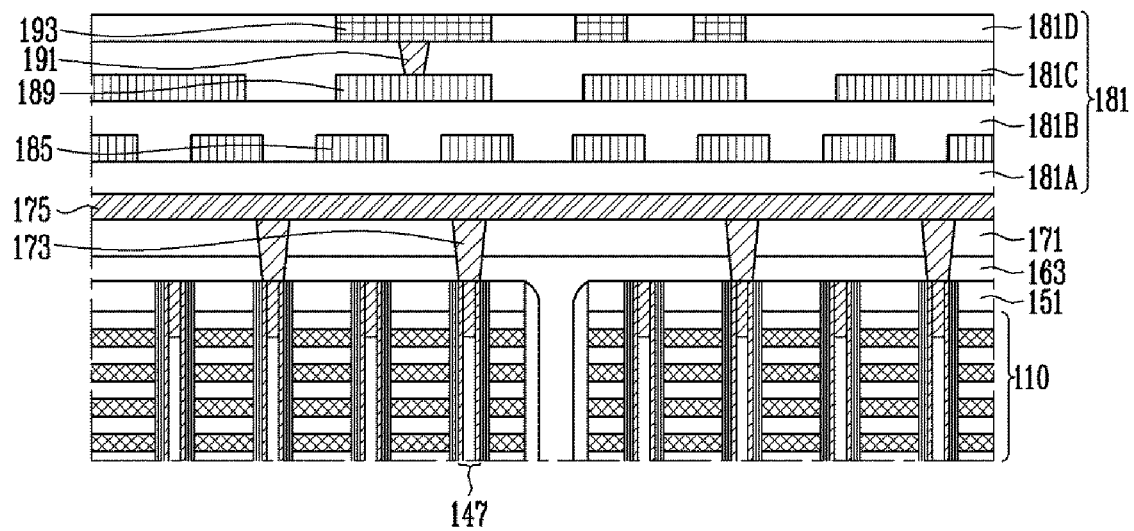

Referring to FIG. 5F, a third insulating layer 171 may be formed on the second insulating layer 163. Subsequently, contact plugs 173 that pass through the third insulating layer 171 or that pass through the third insulating layer 171 and the second insulating layer 163 may be formed. The contact plugs 173 may extend to come into contact with the channel structure 147.

Subsequently, a first line array 175 may be formed. The line array 175 may be a bit line that is coupled to the contact plug 173. Subsequently, a first insulating structure 181 may be formed to cover the first line array 175. The first insulating structure 181 may include two or more insulating layers 181A to 181D. The first connection structures 185, 189, 191, and 193 may be embedded in the first insulating structure 181, and the first connection structures 185, 189, 191, and 193 may be electrically coupled through the contact plugs (not shown).

The first connection structures 185, 189, 191, and 193 may include a first bonding metal 193 with a surface that is exposed to the outside of the first insulating structure 181.

Figure 6:
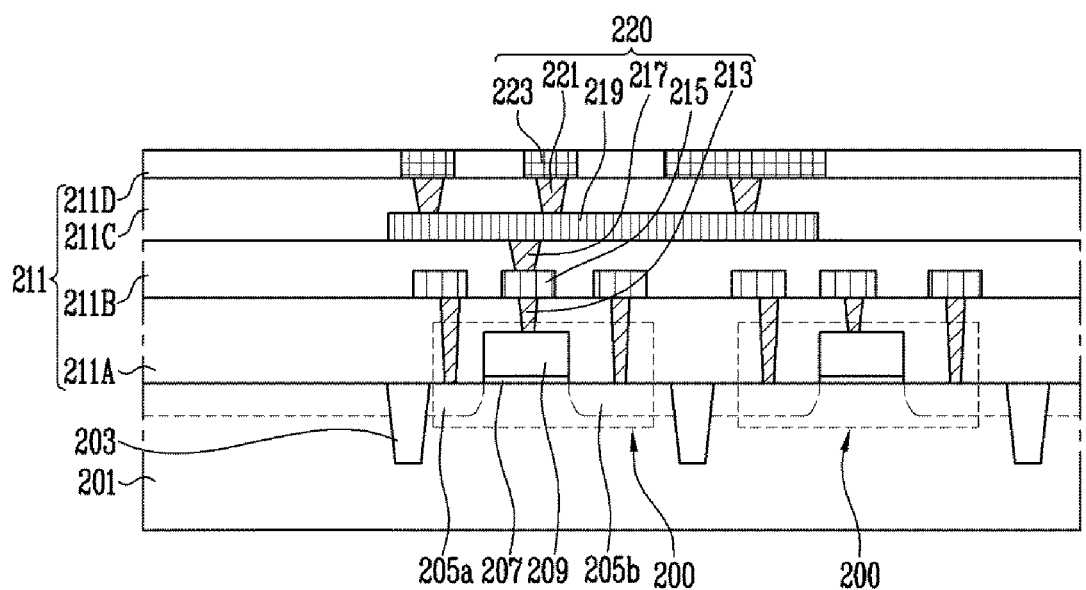

FIG. 6 is a sectional view illustrating a step of forming the CMOS circuit and the second connection structures on a second substrate.

Referring to FIG. 6, the step of forming multiple transistors 200 which constitute the complementary metal oxide semiconductor (CMOS) circuit on the second substrate 201 may be included.

The second substrate 201 may be a bulk silicon substrate, a silicon-on-insulator substrate, a germanium substrate, a germanium-on-insulator substrate, a silicon-germanium substrate, or an epitaxial layer formed by a selective epitaxial growth method.

Each of the transistors 200 may be formed in an active area of the second substrate 201 that is partitioned by an isolation layer 203. Each of the transistors 200 may include a gate insulating layer 207 and a gate electrode 209 that are stacked on a corresponding active area, and junctions 205a and 205b that are formed in the active area on both sides of the gate electrode 209. The junctions 205a and 205b may include a conductive dopant for implementing a corresponding transistor. The junctions 205a and 205b may include at least one of an n-type dopant and a p-type dopant.

After forming the plurality of transistors 200, second connection structures 220 that are connected to the transistors 200 forming the CMOS circuit, and a second insulating structure 211 that covers the second connection structures 220 and the transistors 200 may be formed.

The second insulating structure 211 may include two or more insulating layers 211A to 211D. The second connection structures 220 may be embedded into the second insulating structure 211. Each of the second connection structures 220 may include a plurality of conductive patterns 213, 215, 217, 219, 221, and 223. The second insulating structure 211 and the second connection structures 220 may be changed in various ways without being limited to the example that is shown in the drawings.

The conductive patterns 213, 215, 217, 219, 221, and 223 included in each of the second connection structures 220 may include a second bonding metal 223 with a surface that is exposed to the outside of the second insulating structure 211.

Figure 7:
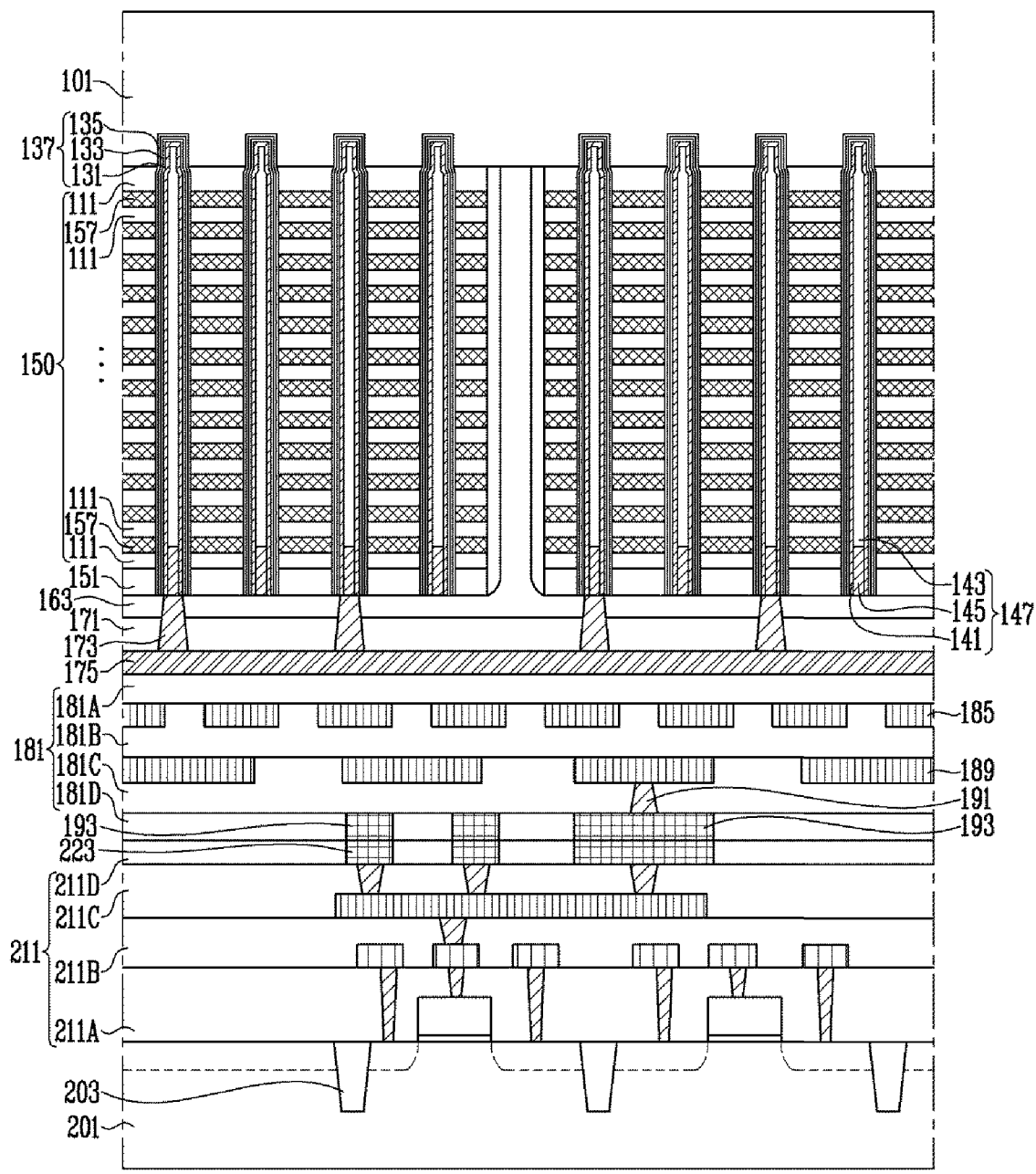

FIG. 7 is a sectional view for explaining a step of bonding the first connection structures and the second connection structures to each other.

Referring to FIG. 7, the first substrate 101 and the second substrate 201 may be aligned so that the first bonding metal 193 on the first substrate 101 and the second bonding metal 223 on the second substrate 201 may be in contact with each other. The first bonding metal 193 and the second bonding metal 223 may include various metals, for example, copper.

Subsequently, the first bonding metal 193 and the second bonding metal 223 may be bonded to each other. To this end, after heat is applied to the first bonding metal 193 and the second bonding metal 223, the first bonding metal 193 and the second bonding metal 223 may be hardened. The present disclosure is not limited thereto, and various processes for coupling the first bonding metal 193 and the second bonding metal 223 may be introduced.

FIGS. 8A to 8D are sectional views for explaining a step of forming a string line coupled to a plurality of cell strings on the gate stacked body 150.

Figure 8A:
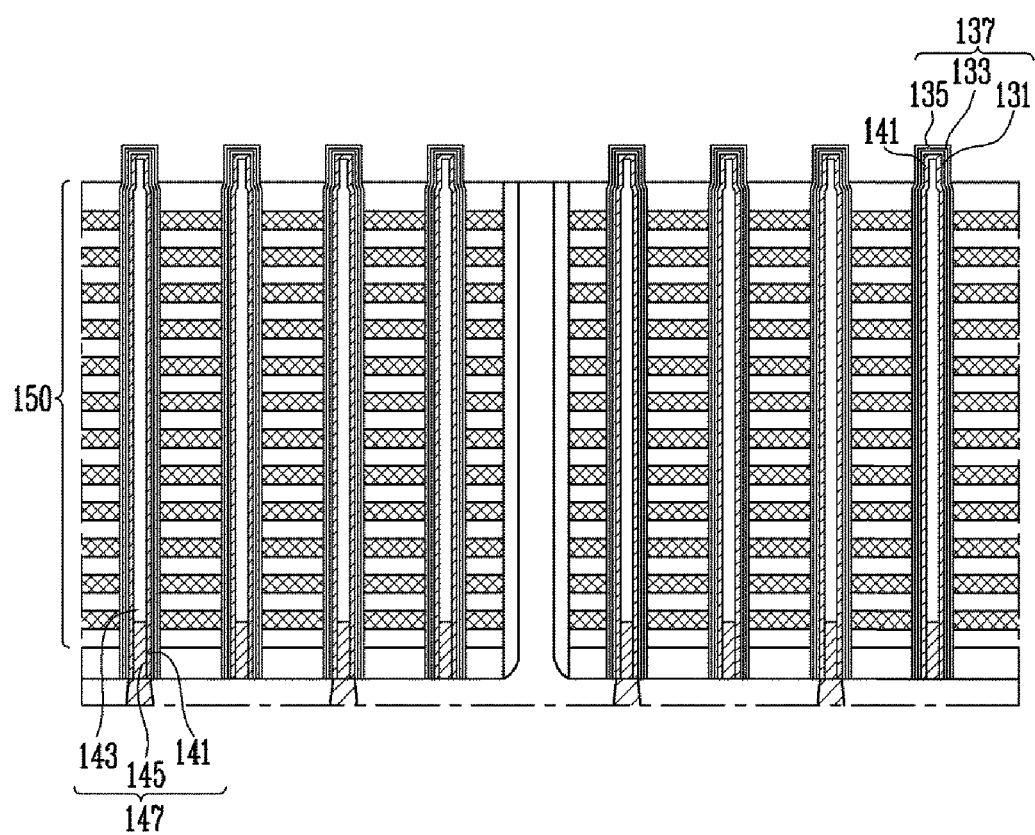

Referring to FIG. 8A, the first substrate 101, shown in FIG. 7, may be removed. When the first substrate 101 is removed, the memory layer 137 may serve as an etch stop layer. Thus, the channel layer 141 that protrudes from the gate stacked body 150 may be protected by the memory layer 137.

Figure 8B:
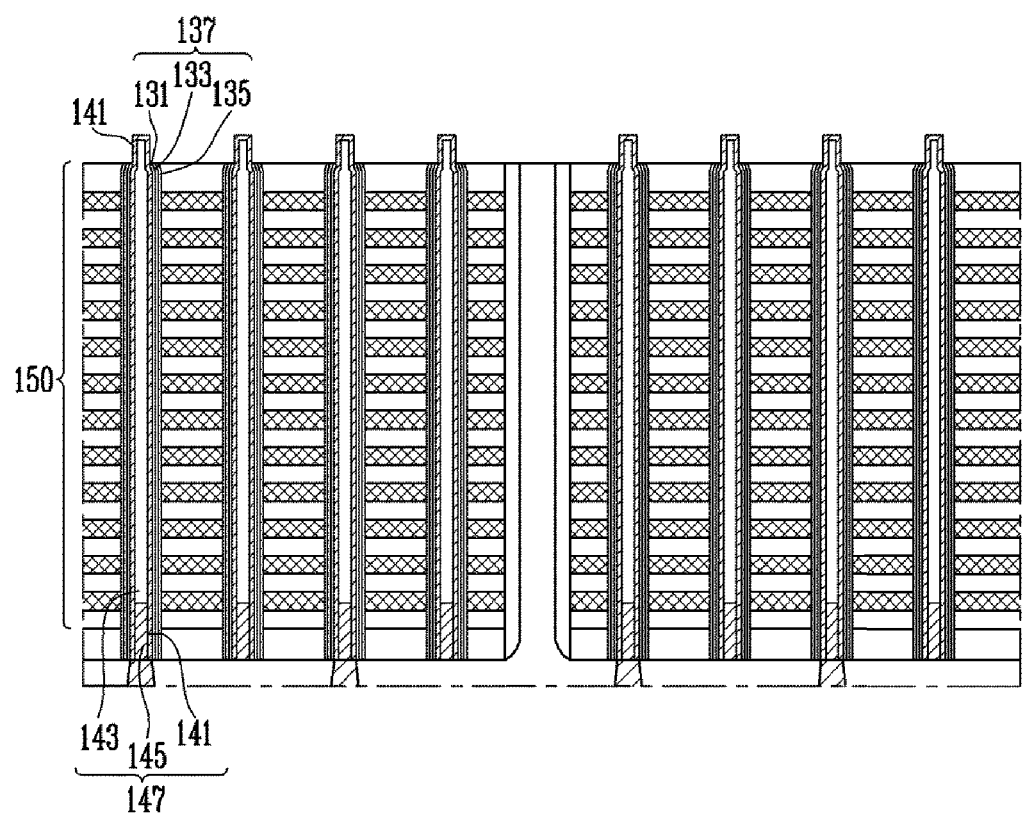

Referring to FIG. 8B, the memory layer 137 that protrudes from the gate stacked body 150 may be removed to expose the channel layer 141. The exposed channel layer 141 may protrude from the gate stacked body 150.

Figure 8C:
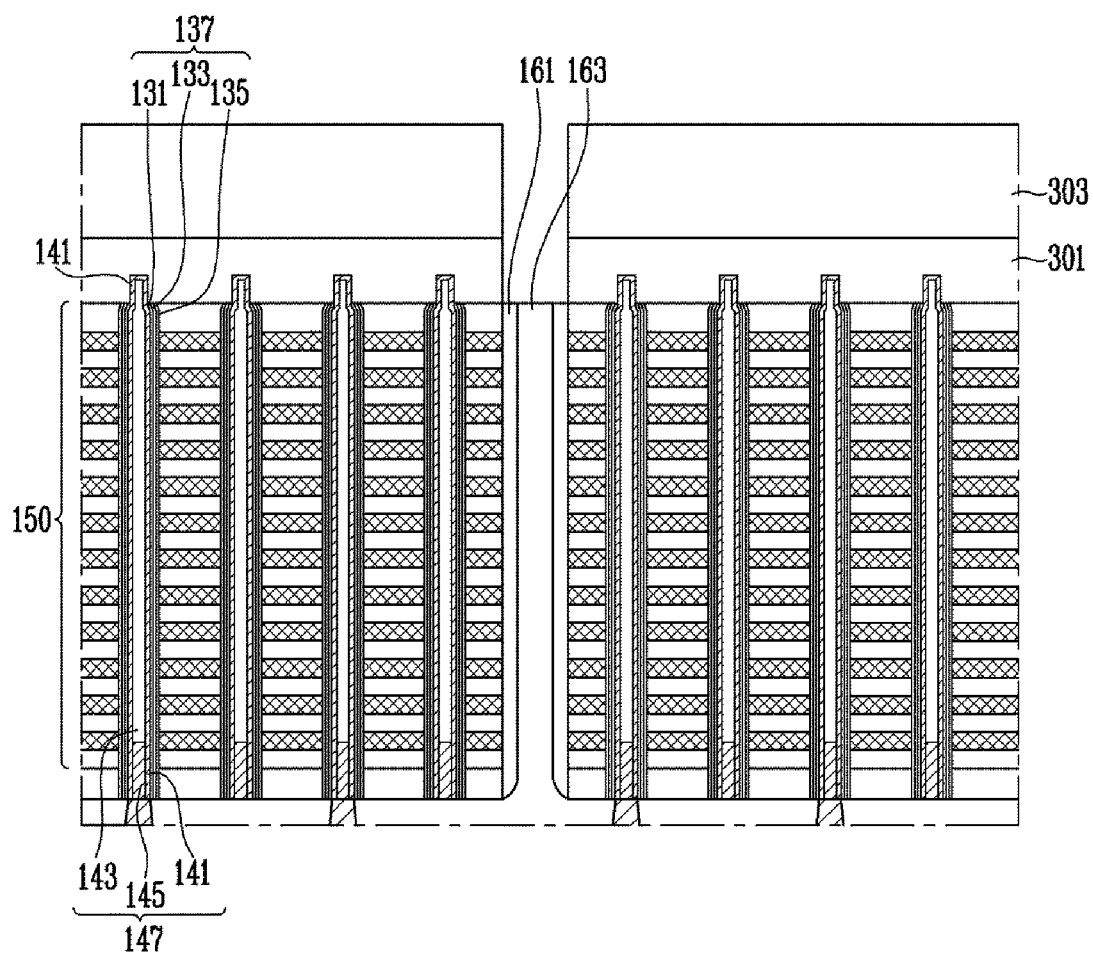

Referring to FIG. 8C, a conductive layer 301 that comes into contact with the protruding channel layer 141 may be formed over the gate stacked body 150. The conductive layer 301 may be formed of a polysilicon layer. Thus, a portion of the channel layer 141 that forms the protrusion of the channel structure 147 may extend into the conductive layer 301. Subsequently, a second mask pattern 303 may be formed on the conductive layer 301. The second mask pattern 303 may be formed to expose the second insulating layer 163 that is formed in the slit. Thereafter, the conductive layer 301 may be patterned by performing an etching process by using the second mask pattern 303. The patterned conductive layer 301 may be formed of at least two or more conductive layers. The layout of the conductive layer 301 may be defined by the second mask pattern 303. In an embodiment of the present disclosure, channel layers 141 of four neighboring channel structures 147 may be electrically coupled to each other by one patterned conductive layer 301. The conductive layer 301 may be patterned in various ways. For example, the patterned conductive layer 301 may correspond to one channel structure 147 and may be electrically coupled to the channel layer 141 of the corresponding channel structure 147.

Figure 8D:
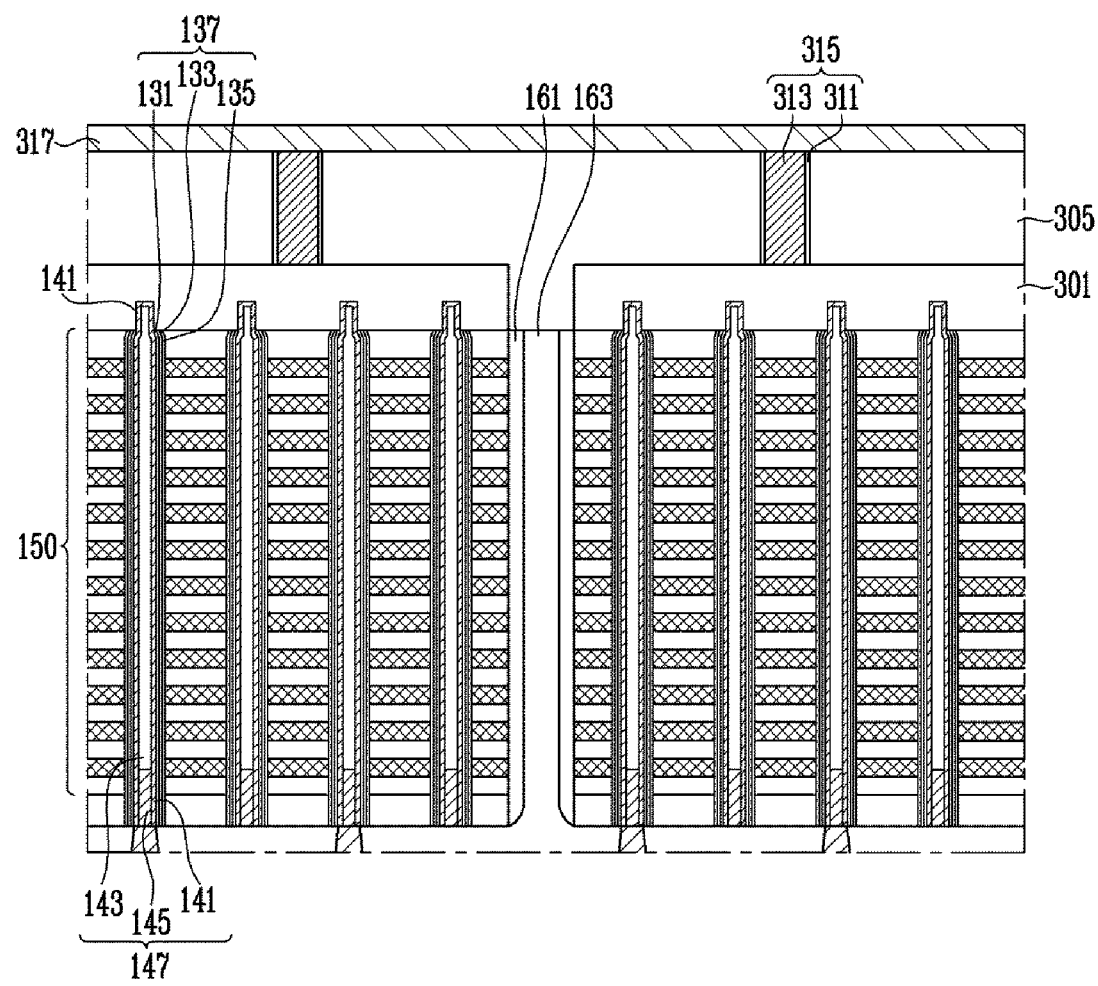

Referring to FIG. 8D, after the second mask pattern 303 of FIG. 8C is removed, an interlayer insulating layer 305 that covers the conductive layer 301 may be formed. Thereafter, contact plugs 315 that passes through the interlayer insulating layer 305 may be formed. Each of the contact plugs 315 may be in contact with the patterned conductive layer 301. Each of the contact plugs 315 may include a diffusion barrier 311 that is formed on a sidewall of the contact hole and a contact conductive layer 313 that fills the contact hole.

Thereafter, upper lines 317 that corresponds to the contact plugs 315 and coupled to the contact plugs 315 may be formed on the interlayer insulating layer 305. The above-described patterned conductive layers 301, contact plugs 315, and upper lines 317 may be defined as the string line STL of FIG. 3.

Figure 9A:
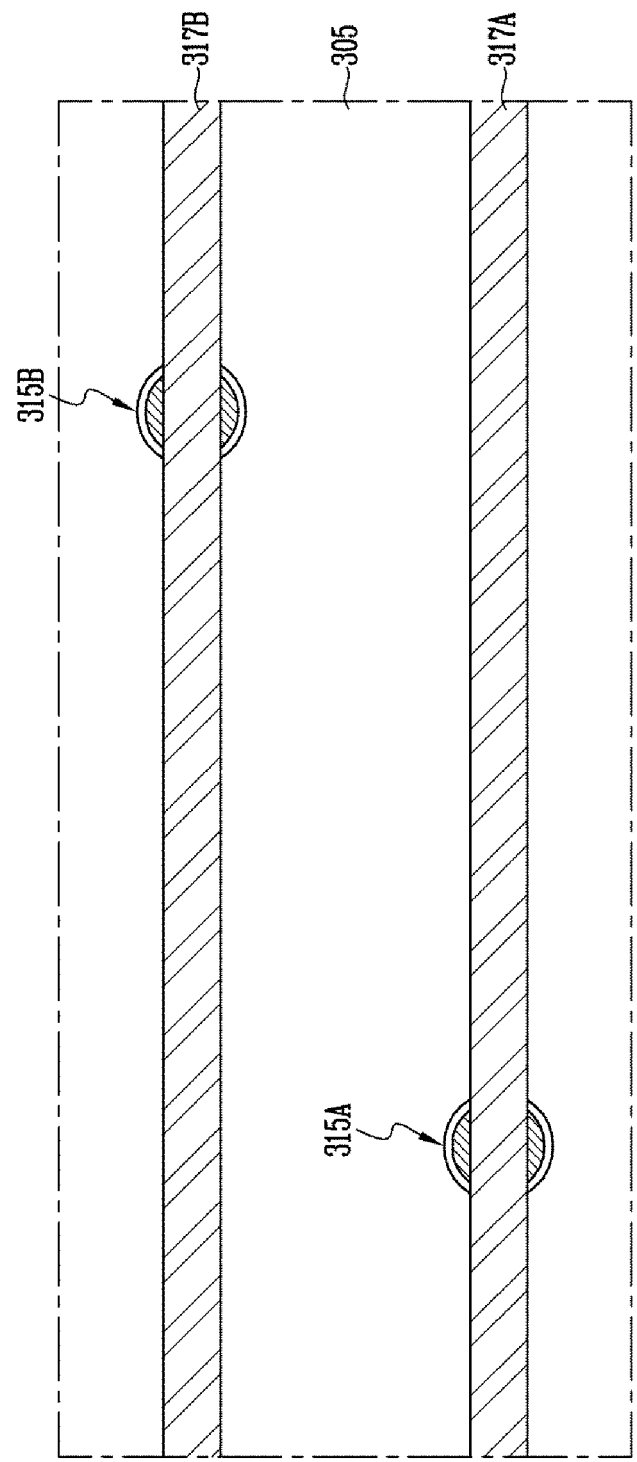
Figure 9B:
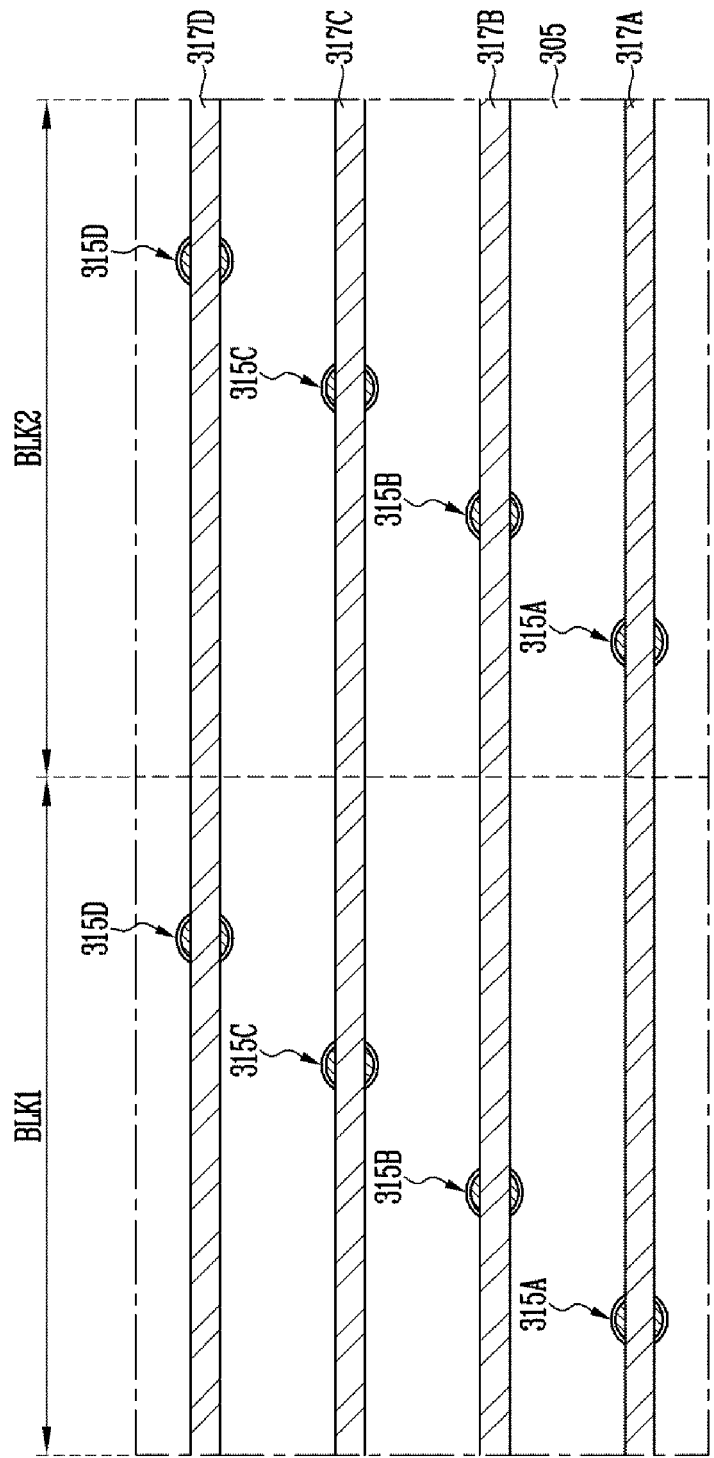

FIGS. 9A and 9B are plan views illustrating a coupling relationship between contact plugs and upper lines.

Referring to FIG. 9A, a plurality of contact plugs 315A and 315B that pass through the interlayer insulating layer 305 may be coupled to a plurality of upper lines 317A and 317B that are parallel to each other, respectively. Thus, among the plurality of channel structures 147 that are shown in FIG. 8D, four channel structures 147 that are coupled to the patterned conductive layer 301 may be coupled to one upper line. The upper lines 317A and 317B may be coupled to the transistors DT1 and DT2 of FIG. 3, respectively.

Referring to FIG. 9B, neighboring memory blocks BLK1 and BLK2 may share a plurality of upper lines 317A, 317B, 317C, and 317D. For instance, the contact plugs 315A of the adjacent memory blocks BLK1 and BLK2 may be coupled to one upper line 317A, the contact plugs 315B of the adjacent memory blocks BLK1 and BLK2 may be coupled to one upper line 317B, the contact plugs 315C of the adjacent memory blocks BLK1 and BLK2 may be coupled to one upper line 317C, and the contact plugs 315D of the adjacent memory blocks BLK1 and BLK2 may be coupled to one upper line 317D.

As described above, according to an embodiment of the present disclosure, the source select transistor for controlling the connection between the source line and the cell strings might not be disposed in the cell string structure, so that a process step may be simplified. Further, the plurality of cell strings may be selectively coupled to the source line through the string line and the discharge unit, so that it is possible to prevent a disturbance phenomenon that is caused by the source select transistor during the read and program operations of the memory block.

Figure 10:
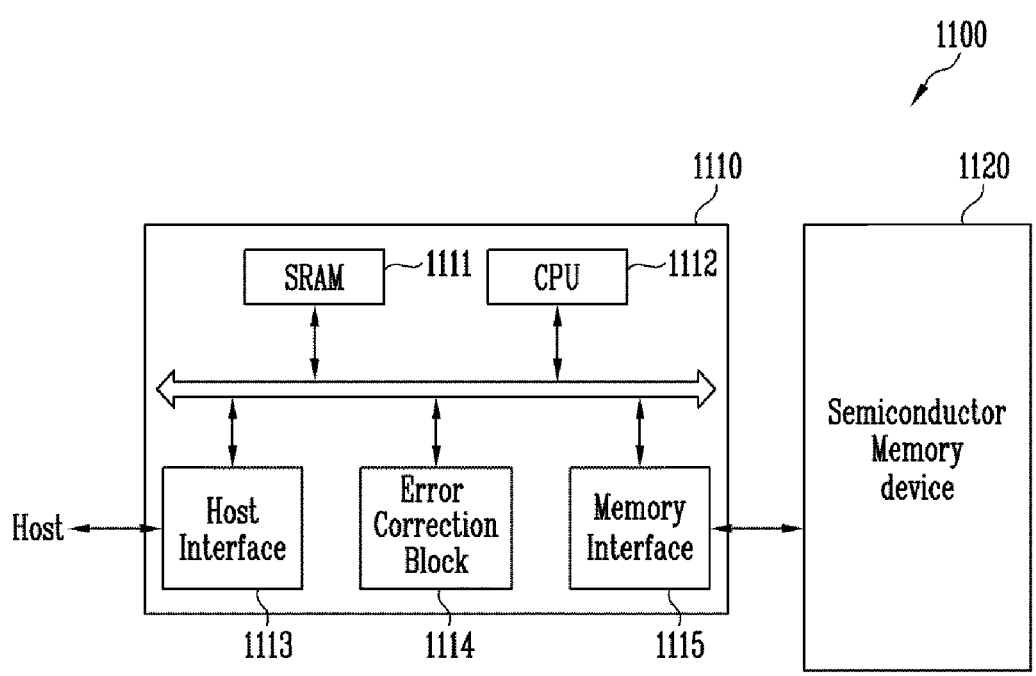
FIG. 10 is a block diagram illustrating the configuration of a memory system in accordance with an embodiment of the present disclosure.

FIG. 10 is a block diagram illustrating the configuration of a memory system 1100 in accordance with an embodiment of the present disclosure.

Referring to FIG. 10, the memory system 1100 may include a semiconductor memory device 1120 and a memory controller 1110.

The semiconductor memory device 1120 may include a plurality of channel structures that are configured to pass through a stacked structure in which a plurality of interlayer insulating layers and a plurality of gate electrodes may be alternately stacked. The plurality of channel structures may include a blocking insulating layer, a charge storage layer, a tunnel insulating layer, a channel layer, and a core insulating layer. In an embodiment, the channel layer may be formed of a multilayer structure, and the multilayer structure may include a polysilicon layer and a silicon germanium layer.

The semiconductor memory device 1120 may be a multi-chip package formed of a plurality of flash memory chips. The semiconductor memory device 1120 may be the semiconductor memory device that is described with reference to FIGS. 1 to 4.

The memory controller 1110 may be configured to control the semiconductor memory device 1120 and may include a static random access memory (SRAM) 1111, a central processing unit (CPU) 1112, a host interface 1113, an error correction block 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host that is coupled with the memory system 1100. Furthermore, the error correction block 1114 may detect and correct an error that is included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or a solid state disk (SSD) equipped with the semiconductor memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and an integrated drive electronics (IDE) protocols.

Figure 11:
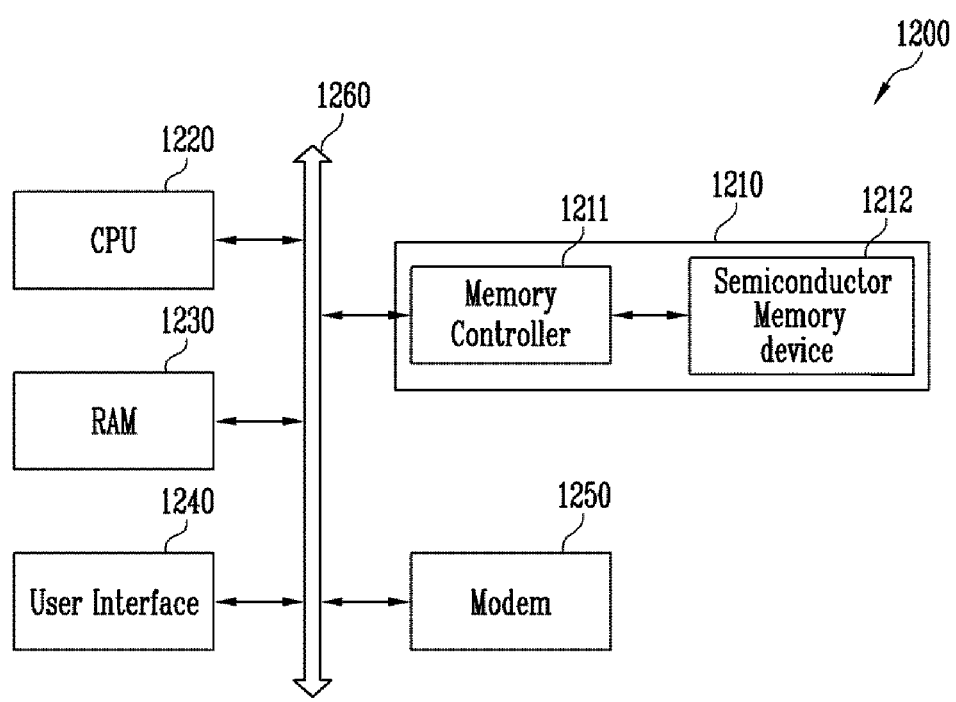
FIG. 11 is a block diagram illustrating the configuration of a computing system in accordance with an embodiment of the present disclosure.

FIG. 11 is a block diagram illustrating the configuration of a computing system according to an embodiment of the present disclosure.

Referring to FIG. 11, the computing system 1200, in accordance with an embodiment of the present disclosure, may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying an operating voltage to the computing system 1200. An application chip set, a camera image processor CIS, a mobile DRAM and the like may be further included.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

According to the present disclosure, a channel of each of a plurality of cell strings included in a memory block can be connected to a source line through a discharge transistor. Hence, the plurality of cell strings has no source select transistor, so that a manufacturing process can be simplified. Furthermore, each cell string and the source line can be selectively connected or disconnected, so that a disturbance phenomenon in program and read operations of a semiconductor memory device can be prevented.

What is claimed is:

1. A semiconductor memory device, comprising:
   a substrate with a complementary metal oxide semiconductor (CMOS) circuit;
   a gate stacked body with interlayer insulating layers and conductive patterns that are alternately stacked over the substrate in a vertical direction;
   a plurality of channel structures passing through the gate stacked body, each with a first end that protrudes above the gate stacked body; and
   a plurality of conductive layers disposed over the gate stacked body; and
   a bit line that is coupled to a second end of the channel structure, the bit line disposed between the substrate and the gate stacked body,
   wherein each of the plurality of conductive layers is in contact with the first end of at least one of the plurality of channel structures.

2. The semiconductor memory device according to claim 1, further comprising upper lines that are coupled to the plurality of conductive layers, respectively.

3. The semiconductor memory device according to claim 2, further comprising a discharge unit that is coupled between each of the upper lines and a source line.

4. The semiconductor memory device according to claim 3, wherein the plurality of channel structures are selectively coupled to the source line through the plurality of conductive layers, the upper lines, and the discharge unit.

5. The semiconductor memory device according to claim 4, wherein the discharge unit is configured to selectively couple at least one channel structure, which is coupled in common to each of the plurality of conductive layers, to the source line in response to discharge signals.

6. The semiconductor memory device according to claim 1, wherein the channel structure comprises:
   a core insulating layer disposed in a central area of the channel structure;
   a doped semiconductor layer disposed in the central area of the channel structure and disposed between the core insulating layer and the bit line; and
   a channel layer extending from between the doped semiconductor layer and a memory layer to between the core insulating layer and the memory layer and between a source line and the core insulating layer.

7. The semiconductor memory device according to claim 6, wherein a portion of the channel layer forms the protruding first end of the channel structure and extends into the conductive layer.

8. The semiconductor memory device according to claim 1, further comprising a memory layer that is disposed between a sidewall of the channel structure and the gate stacked body.

9. The semiconductor memory device according to claim 8, wherein the memory layer is formed to be shorter than the channel structure in the vertical direction.

10. The semiconductor memory device according to claim 1, further comprising:
    conductive connection lines disposed over a lower layer of the bit line;
    an insulating structure configured to enclose the conductive connection lines; and
    conductive connection structures configured to pass through the insulating structure, thereby coupling the conductive connection lines to the CMOS circuit.

11. A semiconductor memory device, comprising:
    a bit line;
    a plurality of cell strings that are coupled at first ends thereof to the bit line; and
    a discharge unit coupled between a source line and second ends of the plurality of cell strings,
    wherein the plurality of cell strings comprise at least one drain select transistor and a plurality of memory cells that are coupled in series between the bit line and the discharge unit, and
    wherein an outermost memory cell, among the memory cells, is electrically coupled to the discharge unit.

12. The semiconductor memory device according to claim 11,
    wherein the plurality of cell strings are coupled to the discharge unit through a plurality of string lines, and
    wherein at least one cell string, among the plurality of cell strings, shares one string line.

13. The semiconductor memory device according to claim 12, wherein the one string line is electrically coupled to a channel structure of the at least one cell string.

14. The semiconductor memory device according to claim 12, wherein the discharge unit comprises a plurality of transistors that are coupled between each of the plurality of string lines and the source line.

* * * * *